(12) United States Patent
Hossack (10) Patent No.: US 6,583,742 B1
(45) Date of Patent: Jun. 24, 2003

(54) DIGITAL TO ANALOGUE CONVERTER WITH DYNAMIC ELEMENT MATCHING

(75) Inventor: David MacDonald Hossack, Edinburgh (GB)

(73) Assignee: Wolfson Microelectronics Limited (GB)

( * ) Notice: Subject to any disclaimer, the term of this patent is extended or adjusted under 35 U.S.C. 154(b) by 0 days.

(21) Appl. No.: 09/622,178
(22) PCT Filed: Feb. 16, 1999
(86) PCT No.: PCT/GB99/00472
§ 371 (c)(1),
(2), (4) Date: Oct. 25, 2000
(87) PCT Pub. No.: WO99/44289
PCT Pub. Date: Sep. 2, 1999

(30) Foreign Application Priority Data

Feb. 26, 1998 (GB) .............................................. 9803928

(51) Int. Cl.[7] .............................................. H03M 1/66
(52) U.S. Cl. ........................ 341/144; 341/153; 341/143
(58) Field of Search ........................... 341/76, 77, 143, 341/144, 153

(56) References Cited

FOREIGN PATENT DOCUMENTS

JP        62-296626    * 12/1987    ............ H03M/1/74

OTHER PUBLICATIONS

Henandez, Binary Weighted C/A Converters with Mismatch Shaping, Electronics Letters, vol. 33 No. 24, pp. 206–2008, Nov. 20, 1997.*

Schreir et al., Noise Shaped Multibit D/A Converter Employing Unit Elements, Electronics Letters, vol. 31 No. 20, pp. 1712–1713, Sep. 28, 1995.*

* cited by examiner

*Primary Examiner*—Howard L. Williams
(74) *Attorney, Agent, or Firm*—Piper Rudnick; Jefferson Perkins (57) ABSTRACT

A digital to analogue converter (DAC) system (30) is described which has a plurality of weighting elements (40) where some of the weighting elements have a different nominal weight from other elements. In a preferred arrangement pairs of elements with the same nominal weight are combined, with each pair of elements having more than two output states. A selection unit is coupled to the elements and an adder is coupled to the selection unit to sum the outputs of the weighted elements. In use, the DAC system receives a digital signal and the selection unit determines the output state of each element combination to provide values of the weighted elements which, when summed, are equivalent to the digital signal. The selection unit also determines the output state of each element in each element combination to minimise errors. An analogue to digital (A/D) converter (200) based on the DAC is also described.

12 Claims, 10 Drawing Sheets

| Inputs | | DEM Outputs | | | Cascade Output of Stage |
|---|---|---|---|---|---|
| A | | $q_1$ | $q_2$ | $q_1+q_2$ | $A-(q_1+q_2)$ |
| even | $x_1 > x_2$ | $+1/2$ | $-1/2$ | 0 | even |
| even | $x_1 <= x_2$ | $-1/2$ | $+1/2$ | 0 | even |
| odd | $x_1+x_2 > 0$ | $+1/2$ | $+1/2$ | +1 | A - 1 (even) |
| odd | $x_1+x_2 <= 0$ | $-1/2$ | $-1/2$ | -1 | A + 1 (even) |

Fig. 7b

Final Stage only:

| Inputs | | DEM Outputs | | |
|---|---|---|---|---|
| A | | $q_1$ | $q_2$ | $q_1+q_2$ |
| -1 | | $-1/2$ | $-1/2$ | -1 |
| 0 | $x_1 < x_2$ | $-1/2$ | $+1/2$ | 0 |
| 0 | $x_1 >= x_2$ | $+1/2$ | $-1/2$ | 0 |
| +1 | | $+1/2$ | $+1/2$ | +1 |

| Inputs | | DEM Outputs | | | Cascade Output of Stage |
|---|---|---|---|---|---|
| A | | $q_1$ | $q_2$ | $q_1+q_2$ | $A-(q_1+q_2)$ |
| even | $x_1 + n > x_2$ | $+1/2$ | $-1/2$ | 0 | even |
| even | $x_1 + n <= x_2$ | $-1/2$ | $+1/2$ | 0 | even |
| odd | $x_1+x_2+n > 0$ | $+1/2$ | $+1/2$ | +1 | A rounded down to next even |
| odd | $x_1+x_2+n <= 0$ | $-1/2$ | $-1/2$ | -1 | A rounded up to next even | n is a random dither signal

Fig. 12b

Final Stage only:

| Inputs | | DEM Outputs | | |
|---|---|---|---|---|
| A | | $q_1$ | $q_2$ | $q_1+q_2$ |
| -1 | | $-1/2$ | $-1/2$ | -1 |
| 0 | $x_1 + n < x_2$ | $-1/2$ | $+1/2$ | 0 |
| 0 | $x_1 + n >= x_2$ | $+1/2$ | $-1/2$ | 0 |
| +1 | | $+1/2$ | $+1/2$ | +1 |

Fig. 12c

DIGITAL TO ANALOGUE CONVERTER WITH DYNAMIC ELEMENT MATCHING

The present invention relates to digital to analogue converters (DACs). In particular, the invention relates to DACs for applications where high DAC linearity is required, for example, in multi-level Σ-Δ modulators.

DACs use elements (components) having weighting values and these elements are selected to produce an output corresponding to the input. The elements selected are summed to produce the output. DAC non-linearity arises because each element has an actual value which is slightly different to its nominal value. This difference may be due to mismatches introduced during the fabrication process. Non-linearity gives rise to distortion.

Figure 1:
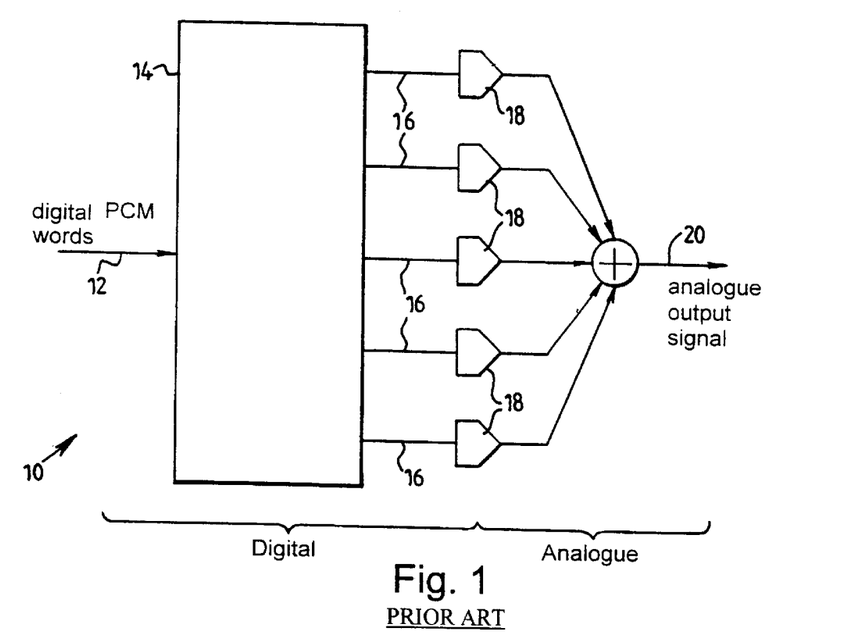
FIG. 1 is a block diagram of a prior art DEM based system.

One known method of correcting for DAC non-linearity uses dynamic element matching (DEM). A known DEM based system 10 is shown in FIG. 1. In the DEM based system 10, a digital pulse code modulation (PCM) sequence on input 12 is decomposed by the DEM system 14 into a plurality of output sequences associated with DEM outputs 16. DEM outputs 16 are used to drive multiple DAC elements 18 whose outputs are summed to provide an analogue signal on output 20. The sum of these output sequences 16 is always equal to the input sequence at every sample instant.

The signal on each DEM output 16 can be either of two levels: one level indicating that the associated DAC element 18 is used, the other level indicating that the associated DAC element 18 is not used; alternatively, one level indicates that the associated DAC element 18 is used in a positive sense, the other level indicates that the associated DAC element 18 is used in a negative sense.

Each DAC element 18 has the same nominal weighting, and the desired analogue signal on output 20 is obtained by using different combinations of the DAC elements 18 (shuffling the DAC elements). This ensures that any errors are randomised, that is, they become noise-like. The DEM system 14 determines the optimum output sequence, which is the sequence having a frequency spectrum with the lowest low frequency power other than that associated with the input digital sequence on signal 12, by using selection logic.

One problem with this technique is that many DAC elements are required to reproduce a large input value and to minimise errors by randomising.

It is an object of the present invention to obviate or mitigate the above disadvantage.

According to a first aspect of the present invention there is provided a digital to analogue converter system comprising:

a plurality of digital to analogue converter elements, where at least some of the elements have a different nominal weight to other elements, and elements having the same nominal weight are associated to form element combinations, each element combination having more than two output states;

a selection unit coupled to the digital to analogue converter elements; and an adder to sum the weighted elements;

whereby, in use, the digital to analogue converter system receives a digital signal and the selection unit determines the output state of each element combination to provide values of weighted elements which, when summed, are equivalent to the digital signal and the selection unit also determines the output state of each element in each element combination to minimise errors.

Preferably, the selection unit is a vector quantiser.

The selection unit may operate according to known techniques, such as the addition technique as described in reference 1 on pages 47 to 50 (see appendix), or the rotation approach as described in reference 1 on pages 46 and 47. The selection unit may determine the output state of each element combination in such a way that the errors average to zero over multiple sample instances.

The selection unit may introduce a dither signal to randomise the selection of the output state of each element.

Preferably, element combinations consist of pairs of elements, thereby providing element combinations with three output states.

Preferably, one of each pair of elements has a positive value and the other of each pair of elements has a negative value. Alternatively, one of each pair of elements has a value of zero and the other of each pair of elements has a positive non-zero value.

Preferably, the elements in each element combination have a binary weight value. Alternatively, any other convenient system of weight values may be used.

Preferably, the selection unit minimises low frequency errors. Alternatively, the selection unit minimises errors in another frequency range, such as high frequency.

It will be appreciated that a digital to analogue converter system as set forth above may be used on its own or it may be incorporated in an application which uses a DAC, for example, an oversampled DAC or a sigma-delta based DAC.

According to a second aspect of the present invention there is provided an analogue to digital converter (ADC) comprising:

a subtractor for receiving a main analogue input and a feedback analogue input, and for producing an output equal to the difference between the main input and the feedback input;

an analogue loop filter coupled to the output of the subtractor;

a quantiser coupled to the output of the analogue loop filter; and a DAC according to the first aspect of the invention;

where the DAC is located in a feedback loop such that the input to the DAC is coupled to the output of the quantiser and the output of the DAC is coupled to the feedback analogue input, whereby, in use, an analogue signal applied to the main input is continuously compared with the signal on the feedback input so that the signal on the output of the quantiser is minimised.

It will be appreciated that the above system may be used with an oversampled multibit analogue to digital converter (ADC).

According to a third aspect of the present invention there is provided a method of converting a digital signal to a corresponding analogue signal, the method comprising the steps of:

providing a digital to analogue converter having a plurality of digital to analogue converter elements, where at least some of the elements have a different nominal weight to other elements and elements having the same nominal weight are associated to form element combinations, each element combination having more than two output states;

receiving a digital signal;

determining the output states for each element combination;

determining for each element combination the output state of each element so that when summed with other elements in the element combination the output state for each element combination is correct and errors are minimised;

whereby, when all of the elements are summed an analogue signal is produced which corresponds to the input digital signal.

It will be appreciated that the present invention has the advantage that there are a number of possible ways to combine the available element combinations to produce a value equivalent to the digital signal, so that the selection unit can choose element values which produce the lowest error. The present invention also has the advantage that elements having different weight values are used so that large output values can be produced using fewer elements than is possible using the known method of having identical unit value elements. The reduced element requirement means that there are fewer components to switch, there is less complexity, and consequently parasitic effects are reduced.

These and other aspects of the present invention will be apparent from the following specific description, given by way of example, in which:

Figure 2:
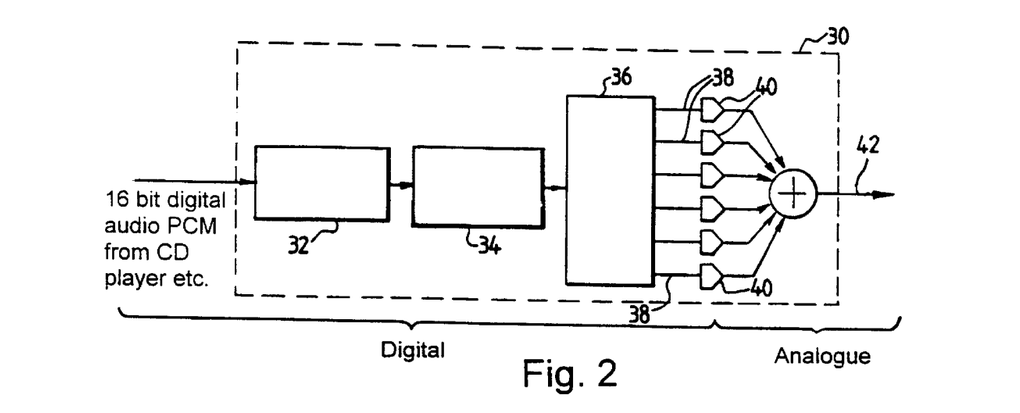
FIG. 2 is a block diagram of a digital to analogue converter according to an embodiment of the present invention for use in a high quality audio system.

FIG. 2 shows a DAC system 30 according to one embodiment of the present invention, where high quality 16–20 bit pulse code modulation (PCM) words are input at 44.1 kHz (non-oversampled). The sample rate is increased by typically 64 or 128 times using an interpolation filter 32. The word length of this oversampled signal is then reduced using a multi-level digital sigma-delta modulator 34 which ensures that the low frequency signal (the audio signal) is retained with high fidelity, and the quantisation noise introduced by reducing the word length is predominantly at high frequencies. This signal then forms the input to the DEM system 36.

In a similar way to the known DEM system 14 of FIG. 1, the DEM system 36 produces a plurality of output sequences associated with DEM outputs 38. DEM outputs 38 are used to drive multiple DAC elements 40 whose outputs are summed to provide an analogue signal on output 42. The sum of these output sequences is always equal to the input sequence at every sample instant. The main difference between DAC elements 40 and DAC elements 18 is that DAC elements 40 have different nominal values; whereas, DAC elements 18 all have the same nominal value.

DEM system 36 controls which DAC elements 40 are selected. The combination of a two-level signal on each DEM output 38 and a DAC element 40 can be considered as a two-level DAC element output. The signal on output 42 is the sum of all of the two-level DAC outputs. The analogue signal on output 42 may be in any form, for example, voltage, current, charge, and the like.

Figure 3A:
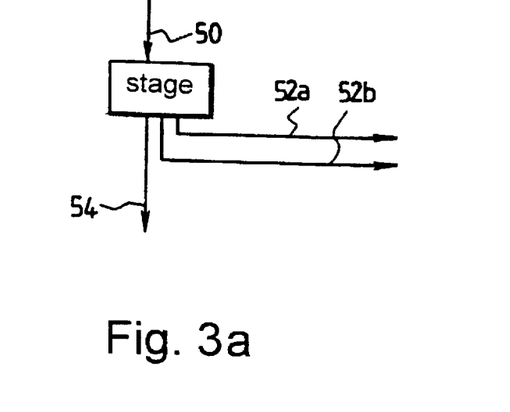
FIG. 3a is a block diagram of a detail of FIG. 2.
Figure 3B:
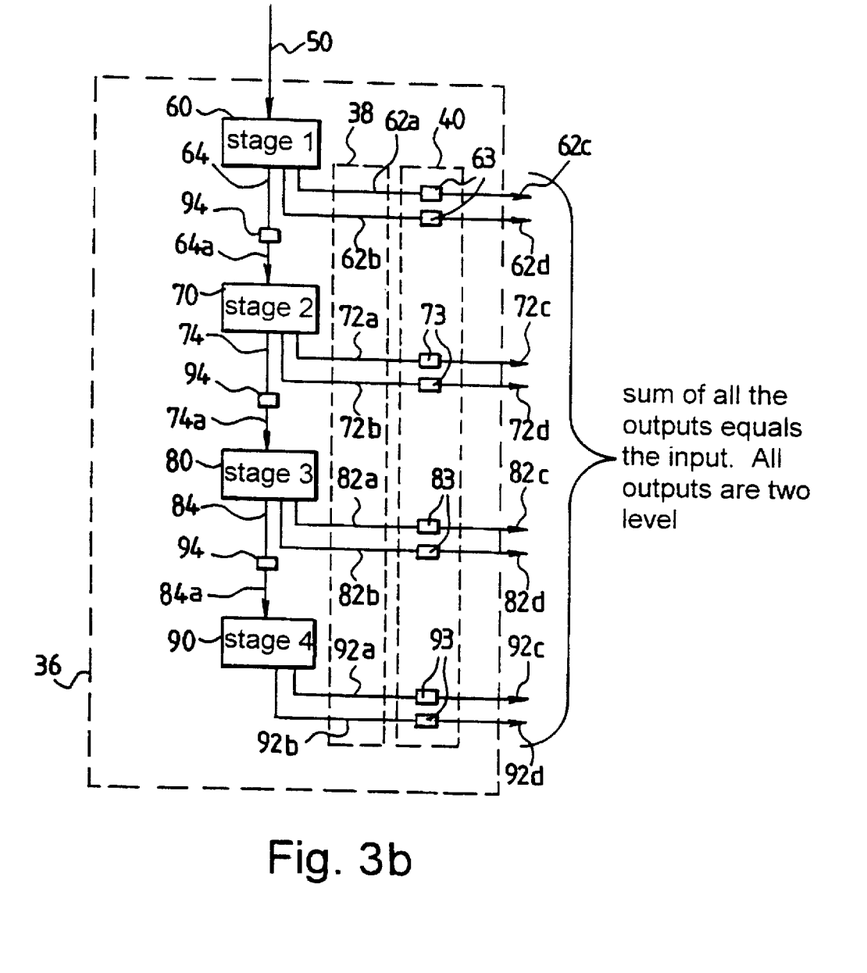
FIG. 3b is one arrangement for use with the FIG. 2 embodiment.

One arrangement of a four stage DEM system 36 is shown in more detail in FIG. 3b. The first three stages are similar to each other, each having an input and three outputs, the fourth stage has an input but only two outputs.

The structure of the first three stages is shown in FIG. 3a, where an input 50 conveys a digital input sequence of bits to represent an integer within a fixed range. More stages may be required to cater for larger integer ranges. The stage has an element combination consisting of two two-level outputs 52a,b each of which conveys a signal having a frequency weighted spectrum. The stage also has a cascade output 54 which conveys a digital signal having fewer possible states than the digital signal on input 50.

There is more than one possible method of producing an output signal having fewer possible states than the input signal. One method is to ensure that after each stage one of the bits is set to zero (beginning with the least significant bit at stage one, bit number two for stage two, and so on). Another method is to ensure that after each stage the number represented by the signal is always even and then to halve the value of that number, which effectively sets the bits to zero starting from the most significant bit; an arrangement for implementing this method is shown in FIG. 3b. It is not critical to select any particular method of reducing the possible states after each stage.

The structure of the fourth stage is similar to that of the first three stages, however, the fourth stage has no cascade output because no cascade output is needed.

For the arrangement of FIG. 3b, if a digital signal having a value in the range from −8 to +8 is applied to input 50, then the first stage 60 decomposes the input digital signal into three output signals. Two of the output signals are conveyed by two-level outputs 62a,b (corresponding to 52a,b in FIG. 3a) to unity weighting multipliers 63, and the third output is conveyed by a cascade output 64. The sum of the signals on outputs 62a,b (which equal outputs 62c,d) and 64 always equals the input signal. Signals on outputs 62c,d form part of the overall DEM system output.

In the FIG. 3b arrangement, the first stage ensures that the signal on the cascade output 64 has fewer possible levels than the input signal by selecting the sum of the signals on outputs 62a,b to ensure that the signal on output 64 is even. If the signal on input 50 is odd then the sum of 62a and b is either −1 or +1. The first stage also ensures that the signals on outputs 62a,b have little low frequency power other than that associated with the input signal, as will be described below.

The cascade output 64 is input to a weighting multiplier 94 (having a value of 0.5) to produce a weighted signal on weighted output 64a. Thus, the signal conveyed by the weighted output 64a has the possible values −4, −3, −2, −1, +1, +2, +3, +4.

Similarly, the second stage 70 receives the signal on weighted output 64a and decomposes this signal into signals on outputs 72a,b and a signal on cascade output 74 having an even value. Thus, the signal conveyed by the cascade output 74 has the possible values −4, −2, 0, +2, and +4. Outputs 72a and b are connected to a weighting multiplier 73 which scales the values of the signals on outputs 72a and b by a value of two to produce weighted signals on outputs 72c and 72d respectively. Outputs 72c and 72d contribute to the overall DEM output.

The cascade output 74 is input to a weighting multiplier 94 (having a value of 0.5) to produce a weighted signal or weighted output 74a.

Similarly, the third stage 80 receives the signal on weighted cascade output 74a and produces signals on outputs 82a,b and an even value signal on cascade output 84. Weighting 83 is used to scale the signals on outputs 82a,b by a value of four to produce weighted signals on outputs 82c and 82d respectively. Outputs 82c and 82d contribute to the overall DEM output. Thus, cascade output 84 has the possible values −2, 0, and +2 and weighted cascade output 84a has the possible values −1, 0 and 1.

The fourth stage 90 receives the signal on weighted cascade output 84a and decomposes this into signals on outputs 92a,b. Weighting 93 is used to scale the signals on outputs 92a,b by a value of eight to produce weighted outputs 92c and 92d. The sum of the signals on two-level outputs 92c,d, 82c,d, 72c,d, and 62c,d equals the analogue value of the digital signal on input 50. All of the two-level outputs (92a,b, 82a,b, 72a,b, and 62a,b) are generated in the same way, using sigma-delta modulators. It will be appreciated that weightings 63, 73, 83 and 93 would usually be implemented within the respective stage in practical embodiments of the present invention. However, for clarity, weightings 63, 73, 83 and 93 (which correspond to weightings 40 in FIG. 2) are shown external to stages 60, 70, 80 and 90 respectively.

Thus, the following signal values are possible:

| | |
|---|---|
| on input 50: | −8, −7, −6, −5, −4, −3, −2, −1, 0, +1, +2, +3, +4, +5, +6, +7, +8; |
| on output 64: | −8, −6, −4, −2, 0, +2, +4, +6, +8; |
| on weighted output 64a: | −4, −3, −2, −1, 0, +1, +2, +3, +4; |
| on output 74: | −4, −2, 0, +2, +4; |
| on weighted output 74a: | −2, −1, 0, +1, +2; |
| on output 84: | −2, 0, +2; |
| on weighted output 84a: | −1, 0, +1; |
| on outputs 62c, d: | −0.5, +0.5 each, −1, 0, +1 when combined; |
| on outputs 72c, d: | −1, +1 each, −2, 0, +2 when combined; |
| on outputs 82c, d: | −2, +2 each, −4, 0, +4 when combined; |
| on outputs 92c, d: | −4, +4 each, −8, 0 +8 when combined. |

Figure 4:
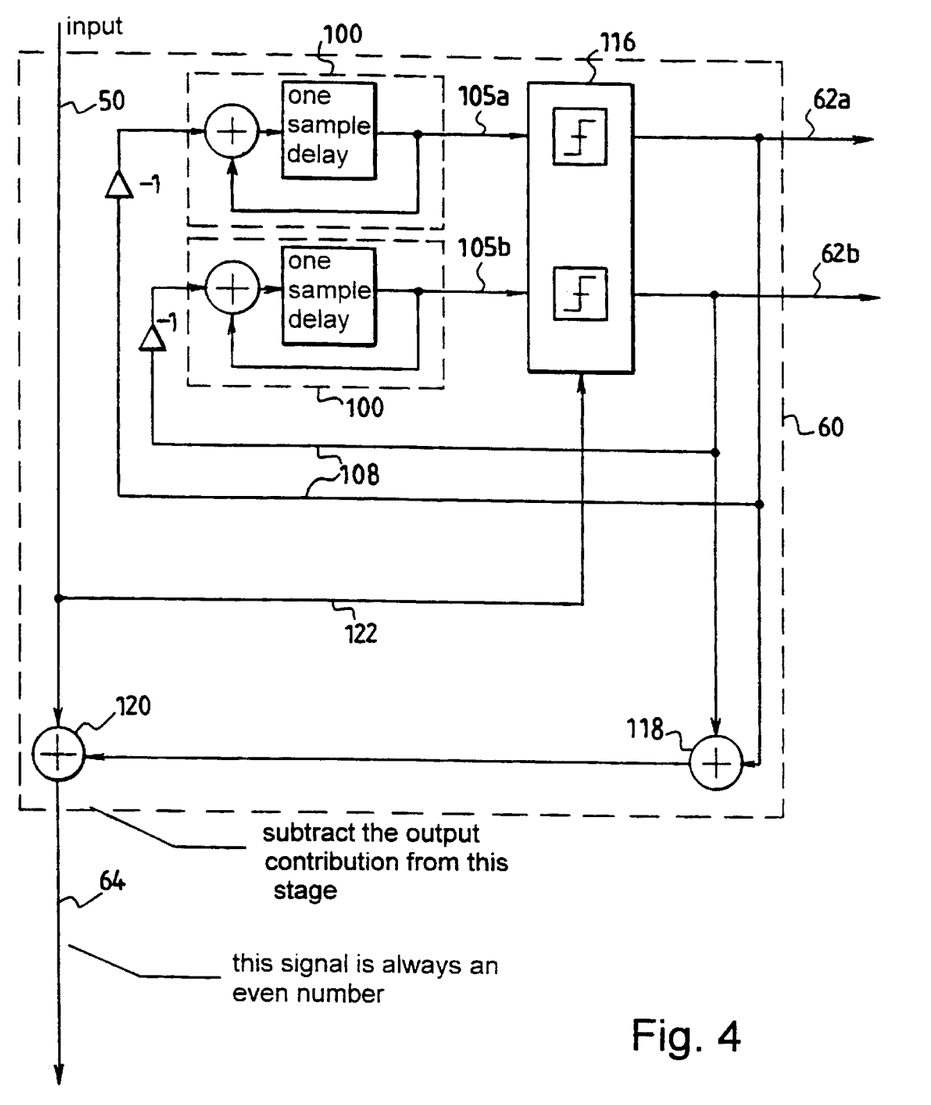
FIG. 4 is a block diagram of a detail of FIG. 3b.
Figure 5:
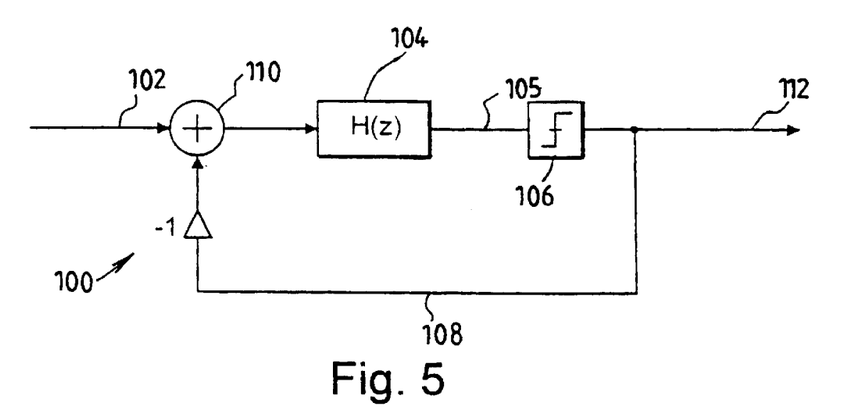
FIG. 5 is a block diagram of a sigma-delta modulator.

FIG. 4 is a more detailed block diagram of the first stage 60 than shown in either FIG. 3a or b, which includes two sigma-delta modulators controlled by a selection unit consisting of a vector quantiser 116. The structure of a sigma-delta modulator is best shown in FIG. 5. The sigma-delta modulator 100 comprises an input 102 (which is not connected in FIG. 4), a loop filter 104, a loop filter output 105, a comparator 106, a feedback loop 108, an adder 110 to add the signal on the input 102 to the signal on the feedback loop 108, and a two-level output 112. In FIG. 4, the single vector quantiser 116 is used to implement the function of the two comparators 106 (FIG. 5). An adder 118 is used to add the two signals on two-level outputs 62a,b to produce a summed value, and a subtractor 120 is used to subtract the summed value from the signal on input 50 to produce a signal on the cascade output 64. This guarantees that the sum of the signals on outputs 62a,b, 64 equals the signal on input 50.

The vector quantiser 116 chooses the value of the signals on the two-level outputs 62a,b subject to the constraint imposed by the value of the signal on input 122. The constraint is used to ensure that the signal at the cascade output 64 has fewer possible levels than the signal on input 50. This means that the signal at each cascade output has at least one more bit which is set to zero than the signal at the input to that stage. The value of the signal on each two-level output is either +½ or −½.

Without any constraint imposed the vector quantiser output signal would only be dependent on the corresponding input signal. If the corresponding input signal was negative, the output signal would have the value −½, if the input signal was positive the output signal would have the value +½. The constraint imposed on the vector quantiser controls the number of two-level output signals having a value of +½ compared with the number of two-level output signals having a value of −½ so that the signal on the cascade output 64 has fewer possible levels than the signal on input 50.

Figure 6:
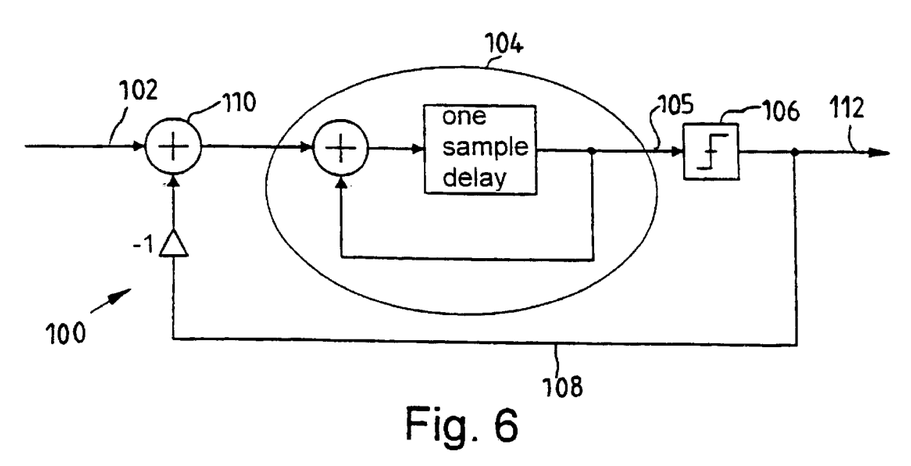
FIG. 6 is a block diagram of a first order sigma-delta modulator as used in FIG. 4.

The loop filters 104 can be designed using standard sigma-delta design methods. For first order sigma-delta modulation the loop filter 104 is an integrator (as shown in FIG. 6) which for a digital sigma-delta modulator can be implemented using an up/down counter. These filters 104 form the memory of the sigma-delta modulator 100. The memory is used to ensure that the signal on each two-level output is not always the same when a certain signal value is input.

Figure 7A:
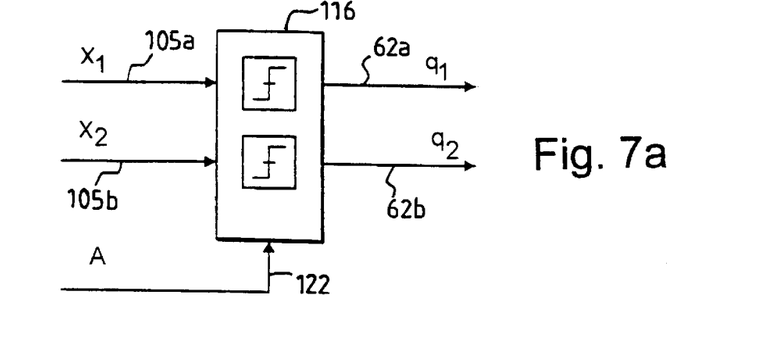
FIG. 7a is a block diagram of the vector quantiser of FIG. 4.

FIGS. 7a, b, and c show the vector quantiser of FIG. 4 and two sets of tables indicating how the vector quantiser determines the signals on outputs 62a,b from the signals on filter outputs 105a,b. There are three possible output states when the signals on outputs 62a and 62b are added, namely the levels −1, 0, and +1. Thus, there is only one possible even value (zero) but there are two ways of obtaining that value; in contrast, there are two possible odd values (−1, +1) but only one way of obtaining each.

Figure 7B:
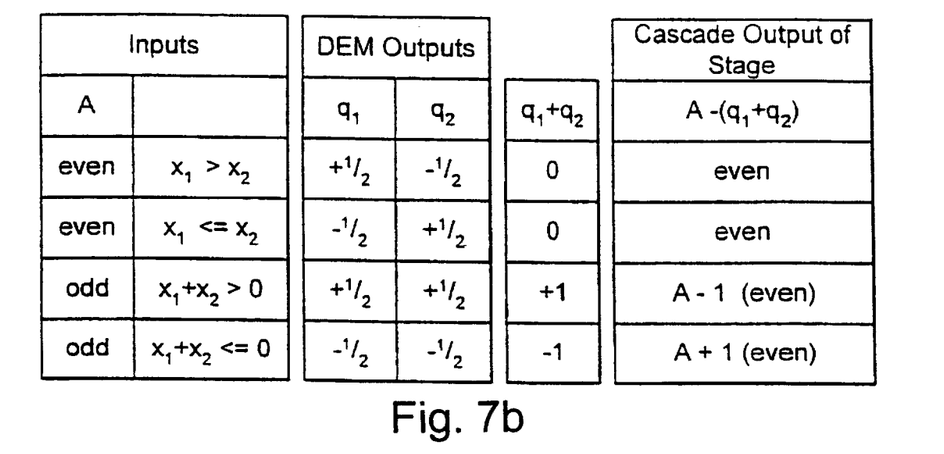
FIG. 7b is a set of tables illustrating the relationship between the inputs and outputs of a vector quantiser for the first three stages of FIG. 4.

As shown in FIG. 7b, if the signal on input 122 is even (zero) then the signal on outputs 62a,b are constrained to be even (zero) and a choice must be made as to whether the signal on output 62a is +½ and the signal on output 62b is −½, or vice versa. This choice is determined by the values of the signals on inputs 105a and 105b.

If the value of input signal 122 is odd (one) then the value of output signals 62a,b are constrained to be odd (1 or −1). A choice must be made as to whether output signals 62a and 62b are to be +½ or to be −½. This choice is also determined by the values of the input signals 105a and 105b.

In particular, if input signal 122 is even and if the value of filter output signal 105a is greater than the value of filter output signal 105b then output signal 62a is set to +½ and output signal 62b is set to −½. However, if input signal 122 is even and the value of filter output signal 105b is greater than or equal to the value of filter output signal 105a then output signal 62a is set to −½ and output signal 62b is set to +½. If input signal 122 is odd and the sum of filter output signals 105a and b is greater than zero then output signals 62*a,b* are both set to +½; whereas, if input signal 122 is odd and the sum of filter output signals 105*a* and *b* is less than or equal to zero then output signals 62*a,b* are both set to −½.

Figure 7C:
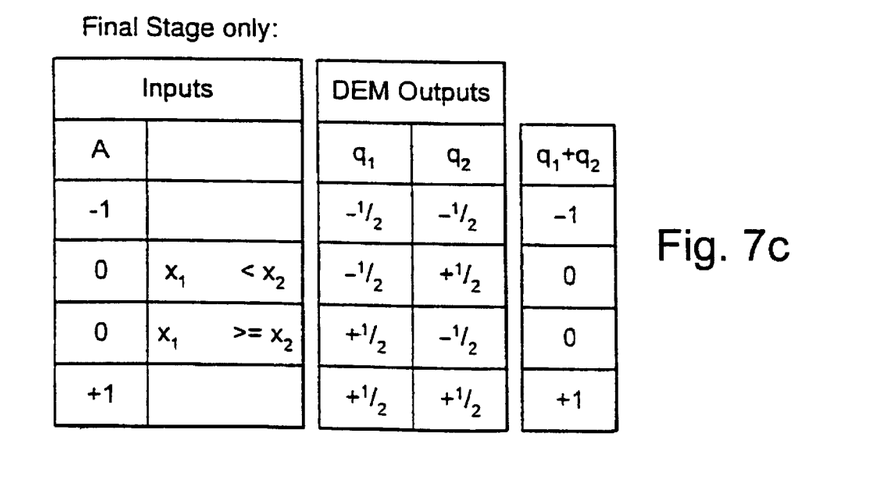
FIG. 7c is a set of tables illustrating the relationship between the inputs and outputs of a vector quantiser for the final stage of FIG. 4.

FIG. 7*c* shows the final (fourth) stage, which indicates how the vector quantiser determines output signals 92*a,b* from filter output signals 105*a,b*. If input signal 122 is −1 then output signals 92*a,b* are both set to −½; if input signal 122 is +1 then both output signals 92*a,b* are set to +½; if input signal 122 is zero and the value of filter output signal 105*a* is less than the value of filter output signal 105*b* then output signal 92*a* is set to −½ and output signal 92*b* is set to +½; if input signal 122 is zero and the value of output signal 105*a* is greater than or equal to the value of output signal 105*b* then output signal 92*a* is set to +½ and output signal 92*b* is set to −½.

Figure 8:
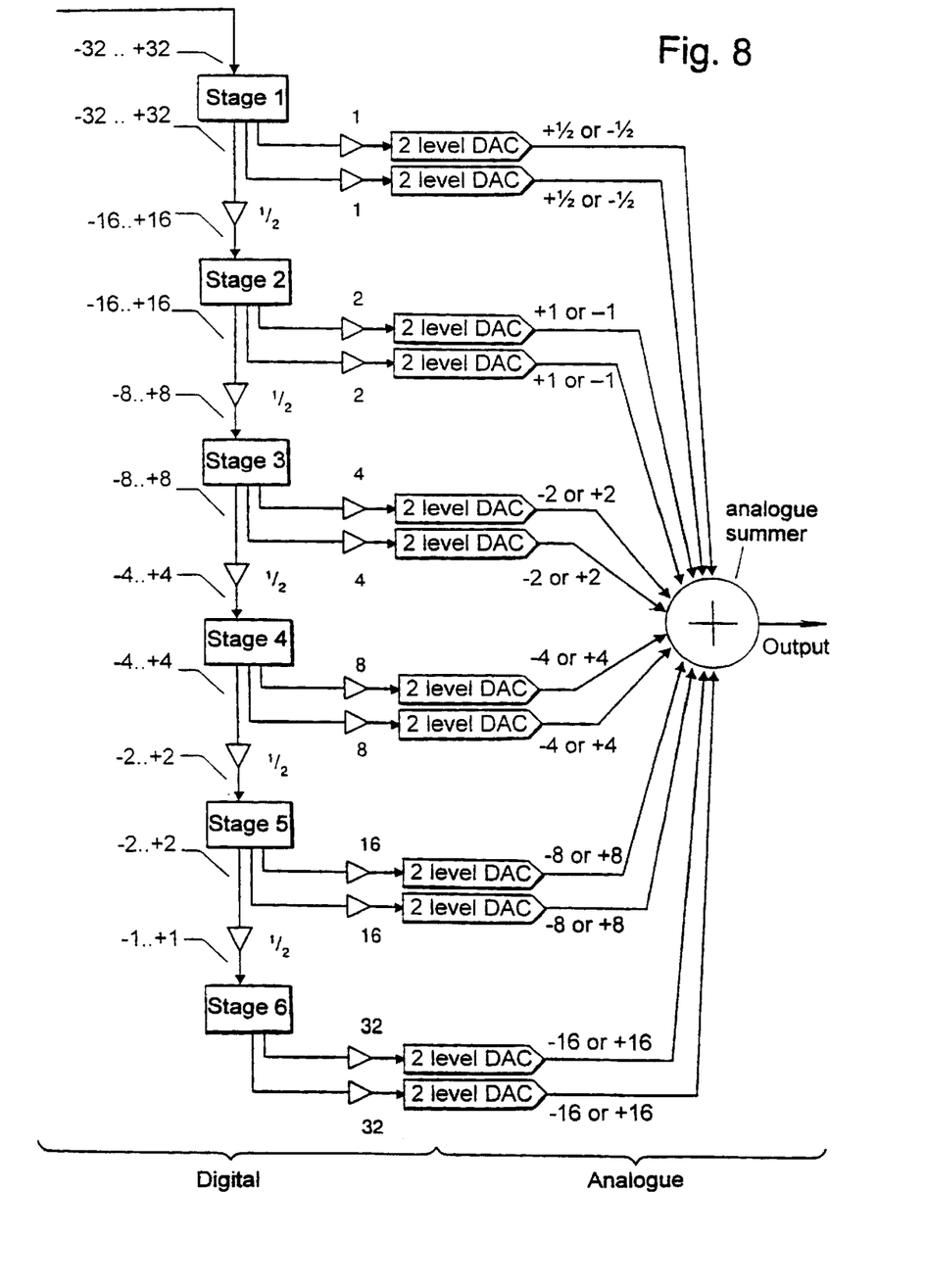
FIG. 8 is a block diagram of a six-stage DAC having binary weighted elements.

FIG. 8. is an example of a six stage DAC for converting a digital signal representing a binary number having a range from −32 to +32. The digital signal is input to the first stage, which produces a cascade output signal having only 33 possible levels (the even numbers between −32 and +32). Thus the number of possible levels on the cascade output has been almost halved. The cascade output signal is then halved (which will never produce a fractional result because the cascade output signal is an even number) and input to stage two. The two two-level output signals from stage two have a gain of two applied to them to compensate for the halving of the previous cascade output signal. The third stage is similar, but a gain of four is applied to the two two-level output signals to compensate for the halving at the output of the first stage and at the output of the second stage. When the sixth stage is reached, the input signal has the value −1, 0, or 1, and a weighting of thirty-two is applied to each of the two two-level output signals. When all of the two-level output signals are summed the total is the analogue equivalent of the digital signal on the input.

Figure 9:
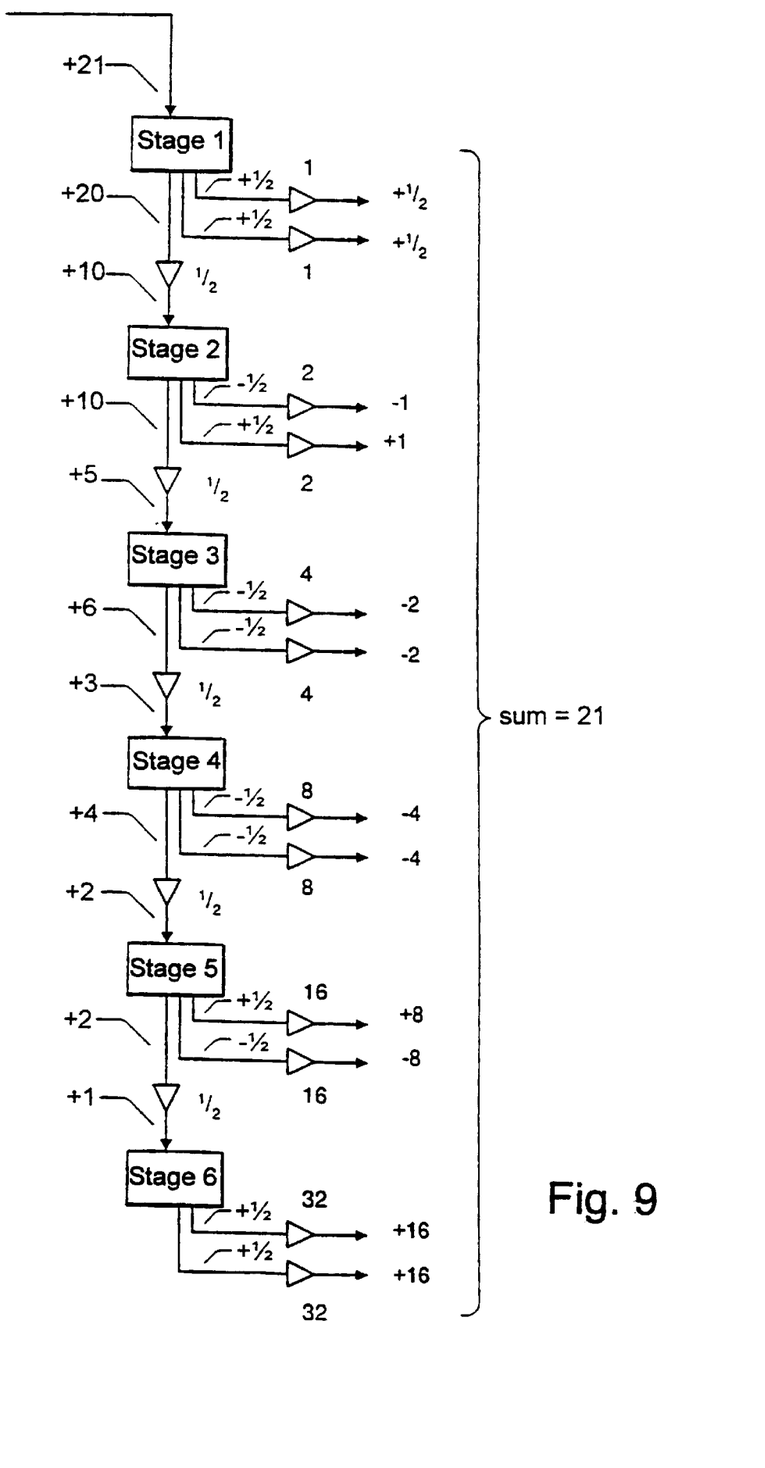
FIG. 9 is a block diagram of the six-stage DAC of FIG. 8 with example values at various stages to illustrate the operation of the DAC.

FIG. 9 is similar to FIG. 8 but with an input binary value of twenty-one ("010101") as an example to illustrate how the six stage DAC operates. The two-level output signals of stage one are both chosen to equal +½ and the cascade output signal is equal to "twenty" ("0101001"). This value (twenty) is then halved to provide an input value of ten ("001010") to stage two. The two two-level output signals of stage two are set to −½ and +½, which give values of −1 and +1 when the weighting of two is applied.

The cascade output signal of stage two (ten, in binary "001010") is then halved to provide an input value of five ("000101") to stage three. The two two-level output signals of stage three are both set to −½, which give values of −2 and −2 when the weighting of four is applied. The sum of the unweighted two-level output signals is −1. This unweighted sum minus one is then subtracted from the input five to provide a cascade output of six ("1000110"). This procedure continues until all six stages have been used. The sum of the weighted two-level output signals is then evaluated, which gives a value of twenty-one.

It will be appreciated that the next time an input value of twenty-one is evaluated different values of two-level output signals may be generated because of the state of the loop filters 104 (FIGS. 4 to 6), which form the memory of the sigma-delta modulator. The vector quantiser operates so as to change the two-level output signals from their previous value. This introduces a degree of randomness to the value of each pair of two-level output signals for a particular value of input signal, which also reduces the possibility of errors arising due to the two-level output signals attaining the same value every time a particular input value is applied.

The next time an input value of twenty-one is received, the sum of the two-level output signals at stage one may be −1, at stage two +1, at stage three +1, at stage four 0, at stage five +1, at stage six 0, which also gives a value of twenty-one when the weighted sums are added.

Figure 13:
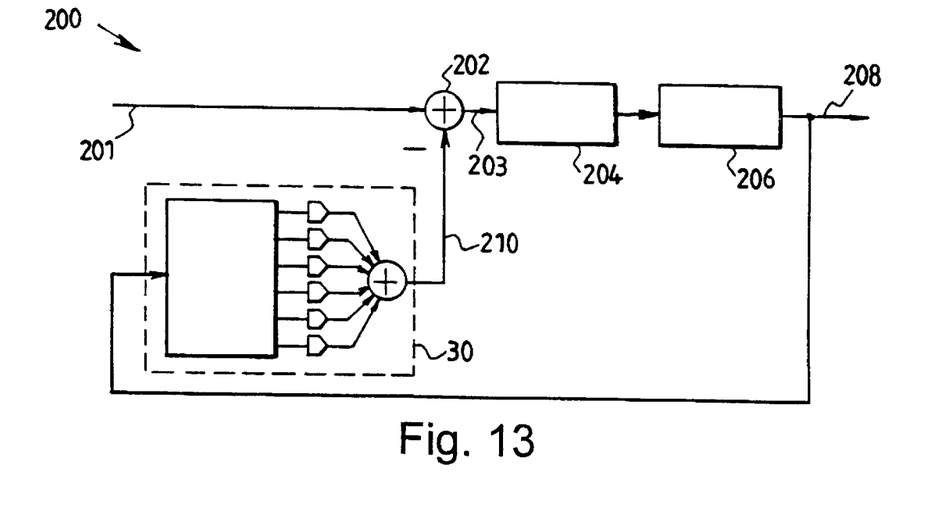
FIG. 13 is a block diagram of an ADC including a DAC according to an embodiment of the present invention.

FIG. 13 shows an ADC 200 incorporating a DAC system 30 as described above.

The DAC system 30 is used with a subtractor 201 in a feedback loop configuration to generate an error signal on line 202, as is well known in the art for conventional ADCs. The ADC 200 has an analogue input 201 for conveying an analogue signal. The DAC system 30 is used with a subtractor 202 in a feedback loop configuration to generate an error signal on line 203, as is well known in the art for conventional ADCs. The error signal on line 203 is filtered by analogue loop filter 204 and then quantised by quantiser 206 to produce a quantised signal on output 208. Output 208 is continuously monitored by DAC 30 and an analogue conversion signal is produced by DAC 30 on DAC output 210. Thus, in use, a series of analogue signals are applied to input 201 and DAC 30 continuously changes the signal on output 210 to minimise the error signal on line 203. The loop filter 204 weights the error signal. DAC 30 produces a stream of output values which represent the digital equivalent of the stream of analogue signals on input 201. In other embodiments additional circuitry is used to average the stream of output values from DAC 30 so as to minimise any errors associated with the resolution of DAC 30.

Figure 10:
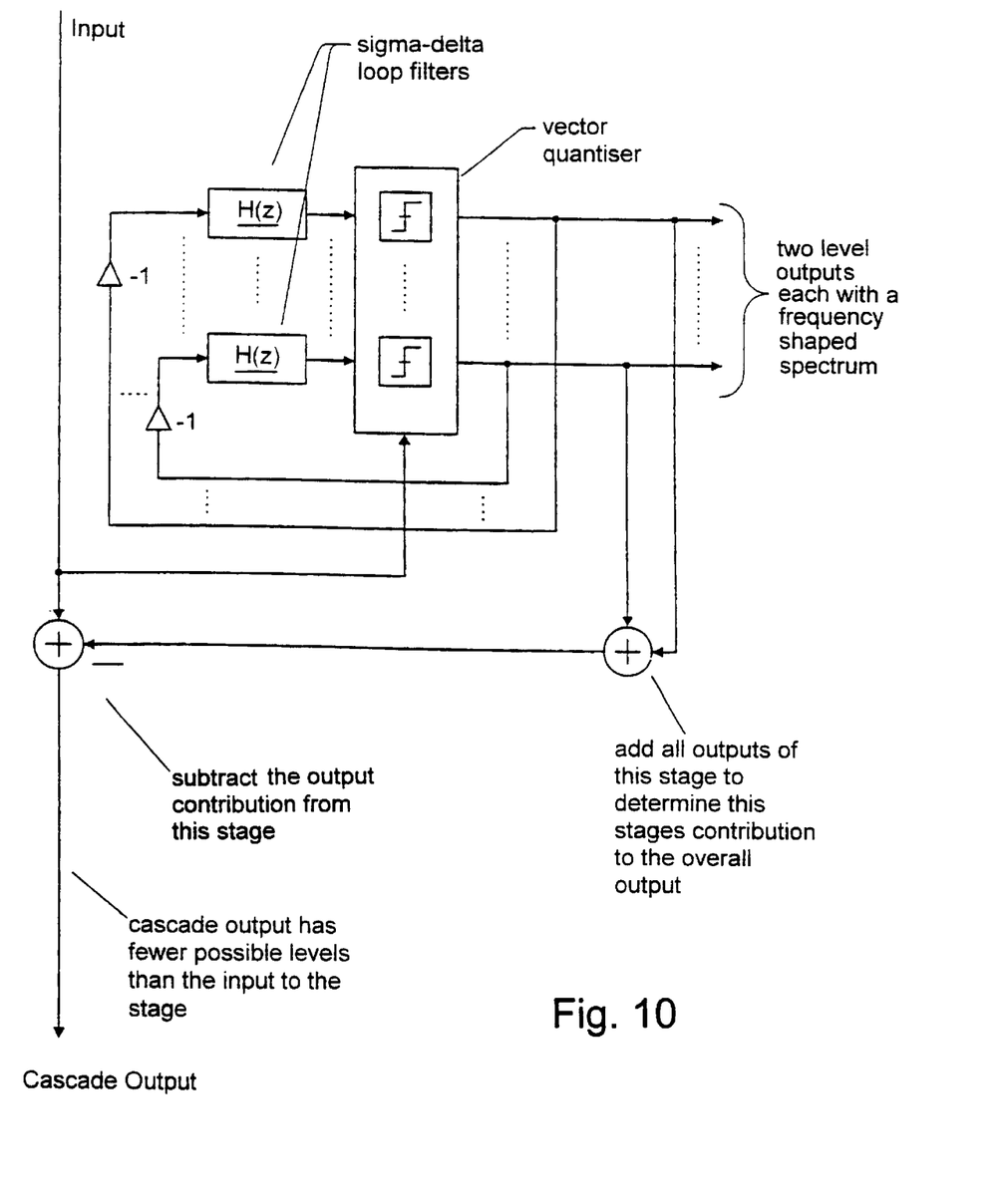
FIG. 10 is a block diagram of a generalised stage having a plurality of $\Sigma$-$\Delta$ modulators.
Figure 11:
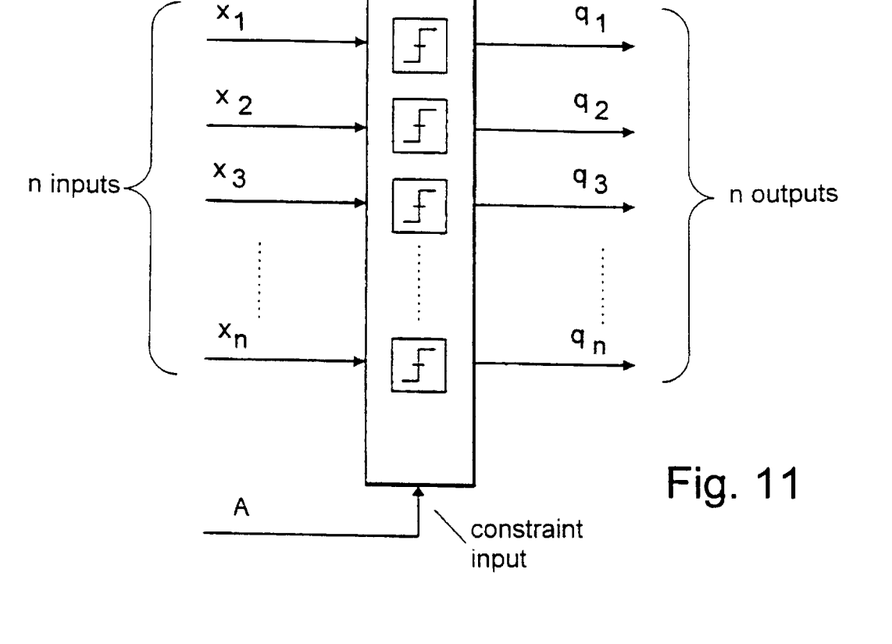
FIG. 11 is a block diagram of a general vector quantiser having n inputs and n outputs.
Figure 12A:
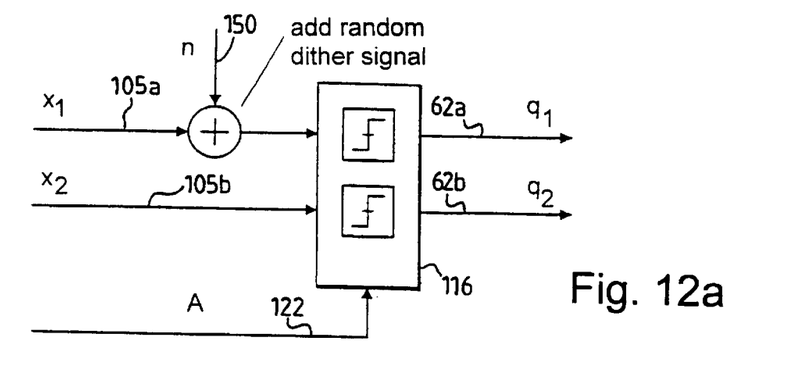
FIG. 12a is a block diagram of a vector quantiser having a random dither signal.
Figure 12B:
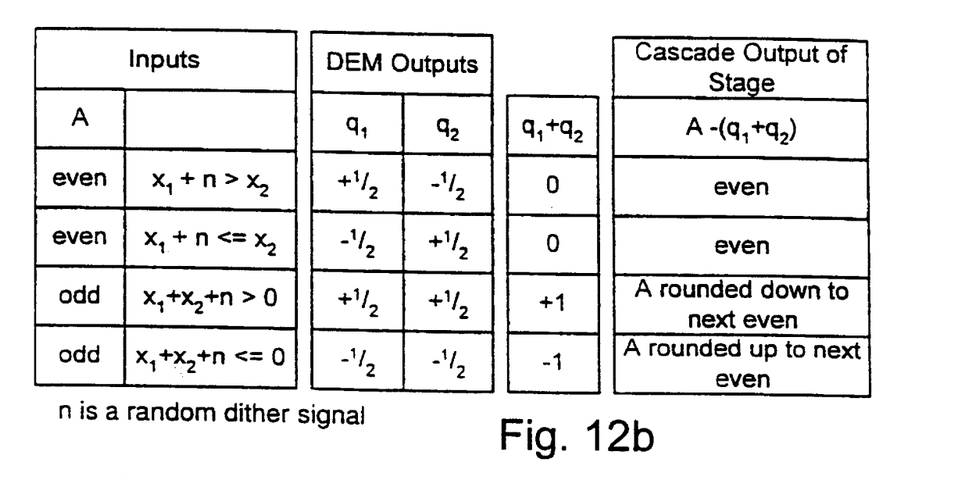
FIG. 12b is a set of tables illustrating the relationship between the inputs and outputs of a vector quantiser having a random dither signal.
Figure 12C:
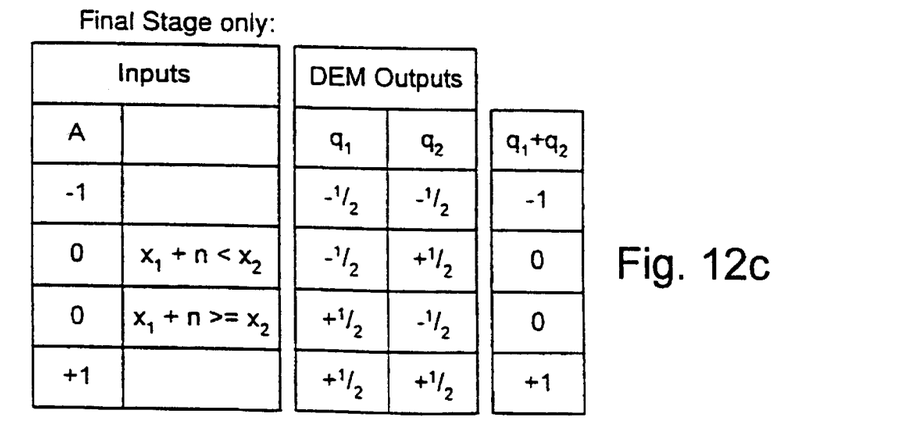
FIG. 12c is a set of tables illustrating the relationship between the inputs and outputs of a vector quantiser having a random dither signal, for the final stage of a DAC.

Various modifications may be made to the above described embodiments within the scope of the present invention, for example, more than two $\Sigma$-$\Delta$ modulators may be used in each stage, as shown in FIG. 10. The general case of a vector quantiser having n outputs is shown in FIG. 11. The number of stages used depends on the number of bits in the input signal 50 which need conversion. In other embodiments, an alternative scheme may be used to reduce the number of output levels of the signal on the cascade output. There is no requirement that each stage is identical to all other stages. The sigma-delta modulators may contain loop filters of different orders. The invention may be used in any digital to analogue conversion system or in any analogue to digital conversion system. The invention may be implemented in software rather than in hardware. When implemented in software, the input signal may be in the form of integer values rather than comprising a binary word having a number of bits. FIG. 12*a* shows a vector quantiser having a random dither signal 150 (labelled n) added to filter output signal 105*a* to randomise the decisions made by the vector quantiser to reduce the likelihood of repetitive patterns being generated in output signals 62*a,b*. In general, a dither signal may be applied to any combination of the filter output signals. FIGS. 12*b* and 12*c* show two sets of tables indicating how the vector quantiser determines output signals 62*a,b* from filter output signals 105*a,b* and dither signal 150.

Appendix

1. Bosco H Leung and Sehat Sutarja, "Multibit $\Sigma$-$\Delta$ A/D Converter Incorporating A Novel Class of Dynamic Element Matching Techniques" IEEE Transactions on Circuits and Systems—II: Analogue and Digital Signal Processing vol 39 no. 1 January 1992 pp35–51.
2. Schreier and B Zhang "Noise Shaped Multibit D/A Converter Employing Unit Elements" Electronics Letters vol 31 no 20 pp1712–1713 September 1995.
3. R T Baird and T S Fiez "Linearity Enhancement of Multibit $\Sigma$-$\Delta$ A/D and D/A Converters Using Data Weighted Averaging" IEEE Transactions on Circuits and Systems—II vol 42 no. 12 December 1995, pp753–762.

4. IEEE book "Delta- Sigma Data Converters" 1997 pp260–263.

What is claimed is:

1. A digital to analogue converter (DAC) system comprising:
   a plurality of digital to analogue converter elements, where at least some of the elements have a different nominal weight to other elements, and elements having the same nominal weight are associated to form element combinations, each element combination having more than two output states;
   a selection unit coupled to the digital to analogue converter elements; and
   an adder to sum the weighted elements;
   whereby, in use, the digital to analogue converter system receives a digital signal and the selection unit determines the output state of each element combination to provide values of weighted elements which, when summed, are equivalent to the digital signal and the selection unit also determines the output state of each element in each element combination to minimise errors.

2. A digital to analogue converter system as claimed in claim 1 wherein the selection unit is a vector quantiser.

3. A digital to analogue converter system as claimed in claim 1 wherein the selection unit introduces a dither signal to randomise the selection of the output state of each element.

4. A digital to analogue converter system as claimed in claim 1 wherein said element combinations consist of pairs of elements, thereby providing element combinations with three output states.

5. A digital to analogue converter system as claimed in claim 4 wherein one of each pair of elements has a positive value and the other of each pair of elements has a negative value.

6. A analogue to digital converter system as claimed in claim 4 wherein one of each pair of elements has a value of zero and the other of each pair of elements has a positive non-zero value.

7. A digital to analogue converter system as claimed in claim 1 wherein the elements in each element combination have a binary weight value.

8. A digital to analogue converter system as claimed in claim 1 wherein the selection unit is configured to minimise low frequency errors.

9. A digital to analogue converter system as claimed in claim 1 wherein the selection unit is configured to minimise errors in another frequency range.

10. An analogue to digital converter (ADC) comprising:
    a subtractor for receiving a main analogue input and a feedback analogue input, and for producing an output equal to the difference between the main input and the feedback input;
    an analogue loop filter coupled to the output of the subtractor;
    a quantiser coupled to the output of the analogue loop filter; and
    a digital to analogue converter (DAC) system comprising:
       a plurality of digital to analogue converter elements, where at least some of the elements have a different nominal weight to other elements, and elements having the same nominal weight are associated to form element combinations, each element combination having more than two output states;
       a selection unit coupled to the digital to analogue converter elements; and
       an adder to sum the weighted elements;
       whereby, in use, the digital to analogue converter system receives a digital signal and the selection unit determines the output state of each element combination to provide values of weighted elements which, when summed, are equivalent to the digital signal and the selection unit also determines the output state of each element in each element combination to minimise errors;
       and wherein the DAC is located in a feedback loop such that the input to the DAC is coupled to the output of the quantiser and the output of the DAC is coupled to the feedback analogue input, whereby, in use, an analogue signal applied to the main input is continuously compared with the signal on the feedback input so that the signal on the output of the quantiser is minimised.

11. An analogue to digital converter system as claimed in claim 10 including an oversampled multibit analogue to digital converter (ADC).

12. A method of converting a digital signal to a corresponding analogue signal, the method comprising the steps of:
    providing a digital to analogue converter having a plurality of digital to analogue converter elements, where at least some of the elements have a different nominal weight to other elements and elements having the same nominal weight are associated to form element combinations, each element combination having more than two output states;
    receiving a digital signal;
    determining the output states for each element combination;
    determining for each element combination the output state of each element so that when summed with other elements in the element combination the output state for each element combination is correct and errors are minimised;
    whereby, when all of the elements are summed an analogue signal is produced which corresponds to the input digital signal.

* * * * *